United States Patent
Hou et al.

(10) Patent No.: US 8,312,327 B2
(45) Date of Patent: Nov. 13, 2012

(54) CORRECTING APPARATUS, PDF MEASUREMENT APPARATUS, JITTER MEASUREMENT APPARATUS, JITTER SEPARATION APPARATUS, ELECTRIC DEVICE, CORRECTING METHOD, PROGRAM, AND RECORDING MEDIUM

(75) Inventors: Harry Hou, Santa Clara, CA (US); Eric Kushnick, Santa Clara, CA (US); Takahiro Yamaguchi, Tokyo (JP); Masahiro Ishida, Tokyo (JP)

(73) Assignee: Advantest Corporation, Tokyo (JP)

( * ) Notice: Subject to any disclaimer, the term of this patent is extended or adjusted under 35 U.S.C. 154(b) by 735 days.

(21) Appl. No.: 12/429,195

(22) Filed: Apr. 24, 2009

(65) Prior Publication Data
US 2010/0275072 A1  Oct. 28, 2010

(51) Int. Cl.
*G06K 5/04* (2006.01)
*G11B 20/20* (2006.01)
*G11B 5/00* (2006.01)

(52) U.S. Cl. .................................................. 714/700
(58) Field of Classification Search .................. 714/700, 714/699, 707, 709, 814, 815, 740; 375/355, 375/371; 713/400, 501, 503; 702/69
See application file for complete search history.

(56) References Cited

U.S. PATENT DOCUMENTS

| | | | | |
|---|---|---|---|---|
| 5,363,319 A * | 11/1994 | Okuda | ............................. | 703/15 |
| 5,724,396 A * | 3/1998 | Claydon et al. | ................ | 375/355 |
| 6,404,357 B1 * | 6/2002 | Taunton | .......................... | 341/61 |
| 7,133,481 B2 * | 11/2006 | Azakami et al. | .............. | 375/355 |
| 7,313,170 B2 * | 12/2007 | Ishioka et al. | ................ | 375/148 |
| 7,421,355 B2 * | 9/2008 | Hou et al. | ........................ | 702/69 |
| 7,715,512 B2 * | 5/2010 | Ichiyama et al. | ............. | 375/371 |
| 7,856,330 B2 * | 12/2010 | Hou et al. | ........................ | 702/70 |
| 7,903,776 B2 * | 3/2011 | Ishida et al. | ................... | 375/371 |
| 7,945,405 B2 * | 5/2011 | Ishida et al. | ................... | 702/69 |
| 7,970,565 B2 * | 6/2011 | Hou et al. | ........................ | 702/69 |
| 8,027,422 B2 * | 9/2011 | Kitta | .............................. | 375/355 |

FOREIGN PATENT DOCUMENTS

| | | |
|---|---|---|
| JP | 2000-184234 | 6/2000 |
| JP | 2000-324537 | 11/2000 |
| JP | 2008-244576 | 10/2008 |
| WO | 2007099918 | 9/2007 |
| WO | 2007118770 | 10/2007 |
| WO | 2008018588 | 2/2008 |

OTHER PUBLICATIONS

"International Search Report of PCT Counterpart Application" issued on Jul. 20, 2010, p. 1-p. 9, PCT/JP2010/002745.
"English translation of the international preliminary report on patentability", issued on Dec. 1, 2011, p. 1-p. 11. (This is the English version of Search Report of PCT counterpart application. Japanese version of this search report was submitted on Aug. 18, 2010).

* cited by examiner

*Primary Examiner* — Phung M Chung
(74) *Attorney, Agent, or Firm* — Jianq Chyun IP Office

(57) ABSTRACT

There is provided a correcting apparatus for correcting a PDF obtained from a measurement result of measuring a characteristic of a measurement target at strobe timings including errors with respect to ideal timings at predetermined intervals, the correcting apparatus including: an interpolation section that is supplied with a CDF of the measurement result, interpolates a value between each strobe timing of the CDF, calculates a value of the CDF at each of the ideal timings, and calculates a corrected CDF at the ideal timings; and a corrected function generating section that generates a corrected PDF in which the errors of the strobe timings for the PDF have been corrected, based on the corrected CDF calculated by the interpolation section.

20 Claims, 11 Drawing Sheets

CORRECTING APPARATUS, PDF MEASUREMENT APPARATUS, JITTER MEASUREMENT APPARATUS, JITTER SEPARATION APPARATUS, ELECTRIC DEVICE, CORRECTING METHOD, PROGRAM, AND RECORDING MEDIUM

BACKGROUND

1. Technical Field

The present invention relates to a correcting apparatus, a PDF measurement apparatus, a jitter measurement apparatus, a jitter separation apparatus, an electronic device, a correction method, a program, and a recording medium.

2. Related Art

One known method of measuring jitter included in a signal uses statistical analysis using a probability density function (PDF) or a histogram. For example, a measurement apparatus can calculate a jitter estimate by using a PDF of the transition edge timings of a signal under measurement.

More specifically, the measurement apparatus for calculating a jitter estimate compares a logical value of a signal under measurement with an expected value, at timings designated by a predetermined strobe signal. The measurement apparatus counts the comparison result with an error counter, to calculate a PDF of transition edge timings of the signal under measurement. The measurement apparatus obtains a distribution parameter (e.g. RMS value, or p-p value) of jitter, from the obtained PDF. The measurement apparatus can also calculate estimates of random jitter and deterministic jitter, by curve fitting the PDF using two Gaussian functions.

A variable delay circuit for generating timings at which a strobe signal is generated and an analogue-to-digital converter for controlling the variable delay circuit have non-linearity. Accordingly, the generation timing of the strobe signal becomes non-linear, which is different from the ideal timing. If a PDF is generated by measuring transition edge timings of a signal under measurement using a strobe signal generated at non-linear timings, the resulting PDF will include a measurement error. This causes an error in a distribution parameter of jitter obtained based on the PDF, and further in the estimates of random jitter and deterministic jitter.

SUMMARY

Therefore, it is an object of an aspect of the innovations herein to provide a correcting apparatus, a PDF measurement apparatus, a jitter measurement apparatus, a jitter separation apparatus, an electronic device, a correction method, a program, and a recording medium, which are capable of overcoming the above drawbacks accompanying the related art. The above and other objects can be achieved by combinations described in the independent claims. The dependent claims define further advantageous and exemplary combinations of the innovations herein.

According to an aspect related to the innovations herein, one exemplary correcting apparatus for correcting a PDF obtained from a measurement result of measuring a characteristic of a measurement target at strobe timings including errors with respect to ideal timings at predetermined intervals, the correcting apparatus includes: an interpolation section that is supplied with a CDF of the measurement result, interpolates a value between each strobe timing of the CDF, calculates a value of the CDF at each of the ideal timings, and calculates a corrected CDF at the ideal timings; and a corrected function generating section that generates a corrected PDF in which the errors of the strobe timings for the PDF have been corrected, based on the corrected CDF calculated by the interpolation section.

An arrangement can be made in which the corrected function generating section generates the corrected PDF, based on a difference in values of the corrected CDF between the adjacent ideal timings.

An arrangement can be made in which the correcting apparatus further includes a CDF calculating section that is supplied with the PDF, calculates the CDF by summing the values of the PDF calculated at each of the strobe timings, and provides the interpolation section with the calculated CDF.

An arrangement can be made in which the ideal timings are linear with respect to a set value of a constant interval, and the correcting apparatus receives the PDF of the measurement result at the strobe timings that are non-linear with respect to the set value.

According to an aspect related to the innovations herein, one exemplary correcting apparatus for correcting a PDF obtained from a measurement result of measuring a characteristic of a measurement target at strobe timings including errors with respect to ideal timings at predetermined intervals, for a CDF of the measurement result at the strobe timings, generates a corrected PDF that is equivalent to a corrected PDF generated based on a corrected CDF at the ideal timing generated by interpolating a value between each strobe timing of the CDF.

According to an aspect related to the innovations herein, one exemplary PDF measurement apparatus for measuring a PDF of a measurement target, includes: a sampling section that measures a characteristic of the measurement target at strobe timings including errors with respect to ideal timings of predetermined intervals, and generates a PDF of a measurement result; an interpolation section that is supplied with a CDF of the measurement result, interpolates a value between each strobe timing of the CDF, calculates a value of the CDF at each of the ideal timings, and calculates a corrected CDF at the ideal timings; and a corrected function generating section that generates a corrected PDF in which the errors of the strobe timings for the PDF have been corrected, based on the corrected CDF calculated by the interpolation section.

An arrangement can be made in which the PDF measurement apparatus further includes an error detection section that detects the errors of the strobe timings with respect to the ideal timings, where the interpolation section generates the corrected PDF further based on the errors detected by the error detection section.

An arrangement can be made in which the ideal timings are linear with respect to a set value of a constant interval, the sampling section measures the measurement target at the strobe timings that are non-linear with respect to the set value, and the error detection section detects the non-linearity of the strobe timings.

According to an aspect related to the innovations herein, one exemplary jitter measurement apparatus for measuring a jitter value of a signal under measurement, includes: a PDF measurement apparatus according to claim 6 that measures a PDF of the jitter value of the signal under measurement; and a jitter value calculating section that calculates the jitter value of the signal under measurement, based on the corrected PDF generated by the PDF measurement apparatus.

According to an aspect related to the innovations herein, one exemplary jitter separation apparatus for separating at least one of a deterministic component and a random component from a measurement result of jitter of a signal under measurement, includes: the PDF measurement apparatus that measures a PDF of a jitter value of the signal under measurement; and a separation section that separates at least one of the deterministic component and the random component from the corrected PDF generated by the PDF measurement apparatus.

According to an aspect related to the innovations herein, one exemplary electronic device operating according to a signal supplied thereto, includes: an operation circuit that generates a response signal corresponding to the supplied signal; and the PDF measurement apparatus that measures a PDF of a characteristic of the response signal.

According to an aspect related to the innovations herein, one exemplary correcting method for correcting a PDF obtained from a measurement result of measuring a characteristic of a measurement target at strobe timings including errors with respect to ideal timings at predetermined intervals, the correcting method includes: being supplied with a CDF of the measurement result, interpolating a value between each strobe timing of the CDF, calculating a value of the CDF at each of the ideal timings, and calculating a corrected CDF at the ideal timings; and generating a corrected PDF in which the errors of the strobe timings for the PDF have been corrected, based on the corrected CDF having been calculated.

According to an aspect related to the innovations herein, one exemplary program causes a computer to function as the correcting apparatus.

According to an aspect related to the innovations herein, one exemplary recording medium records thereon the program.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Figure 1:
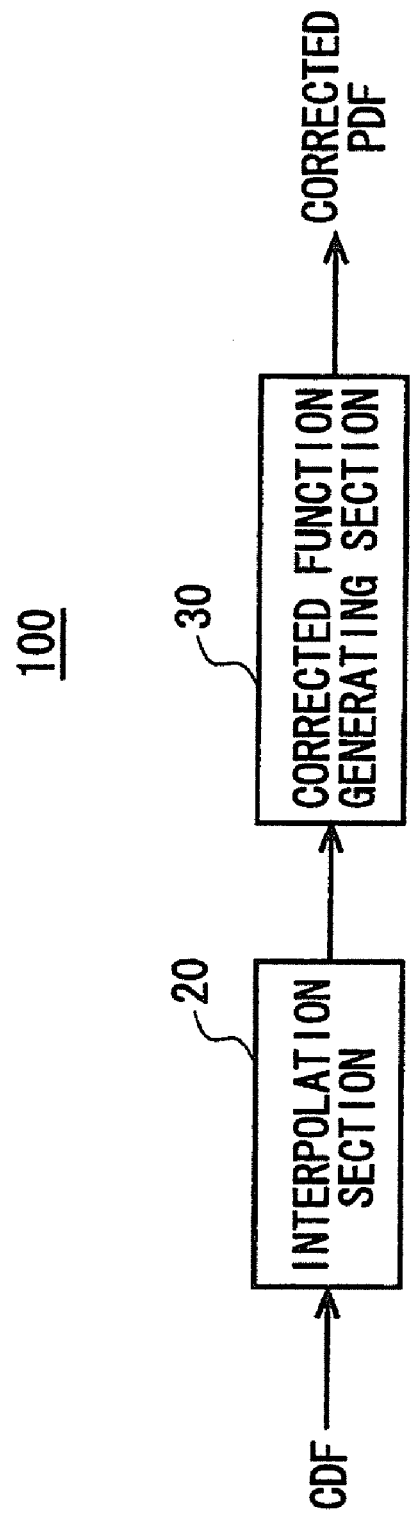
FIG. 1 shows a configuration of a correcting apparatus 100.

Some aspects of the invention will now be described based on the embodiments, which do not intend to limit the scope of the present invention, but exemplify the invention. All of the features and the combinations thereof described in the embodiment are not necessarily essential to the invention. The same or similar elements may occasionally be provided with the same reference numeral, with the related description thereof omitted.

FIG. 1 shows a configuration of a correcting apparatus 100. The correcting apparatus 100 corrects a PDF obtained from a result of measuring a characteristic of a measurement target at predetermined strobe timings. The value of a characteristic under measurement, the PDF of which is to be corrected by the correcting apparatus 100, may be a fluctuation value of the timing at which the logical value of the signal under measurement changes (hereinafter referred to as "jitter"), or may be a voltage value or an electric-current value of the signal under measurement. The correcting apparatus 100 may measure an electric signal, or may measure a signal such as an optical signal or a magnetic signal.

A PDF is a histogram obtained by measuring the characteristic value of the measurement target a plurality of number of times. For example, the PDF may be a histogram of the number of times at which the logical value of the signal under measurement changes between adjacent strobe timings.

The predetermined strobe timings used in measuring the characteristic value of the measurement target may occasionally include an error with respect to ideal timings generated at constant intervals. A variable delay circuit for generating a strobe timing and an analog-to-digital converter for controlling the variable delay circuit both have a non-linear characteristic with respect to a set value. Even being set to a value at which a strobe signal of an ideal timing can be generated, the variable delay circuit may still generate a strobe signal at a timing different from the ideal timing, because of its non-linear characteristic. Consequently, the generation timing of the strobe signal may vary non-linearly with respect to the set value.

When the strobe timings vary non-linearly with respect to the set value, the interval between adjacent strobe timings will not be constant. For example, the jitter measurement apparatus measures the number of times at which the logical value of the signal under measurement changes between adjacent strobe signals which have mutually different relative phases with respect to the signal under measurement. The number of timings of transitions included in a strobe-timing interval that is longer than a predetermined interval will be greater than the number of timings of transitions included in the predetermined strobe-timing interval. On the other hand, the number of timings of transitions included in a strobe-timing interval that is shorter than the predetermined interval will be smaller than the number of timings of transitions included in the predetermined strobe-timing interval.

The PDF resulting from performing measurement at strobe timings that are non-linear with respect to a set value has irregularities in shape. Consequently, the result of analysis conducted using the PDF may be erroneous. For example, when the PDF is a jitter PDF, the distribution parameter of jitter, and the result of separating types of jitter calculated from the PDF are erroneous.

Figure 2:
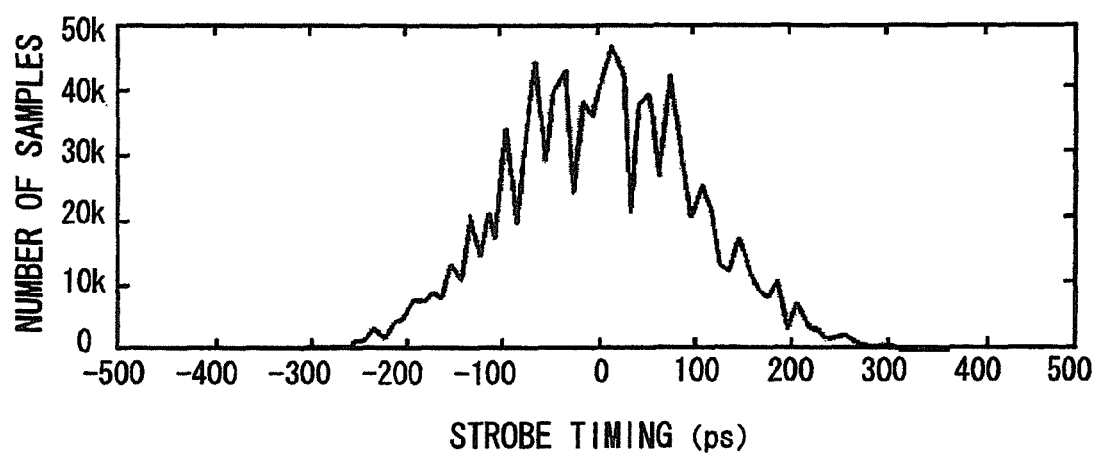
FIG. 2 shows an exemplary PDF when a signal under measurement is measured at non-linear strobe timings.

FIG. 2 shows an exemplary PDF when a signal under measurement is measured at non-linear strobe timings. When measured at linear strobe timings, the PDF of the signal under measurement used here is in a Gaussian distribution. The lateral axis in FIG. 2 represents strobe timings. In the present embodiment, the strobe timing occurs at about every 10 ps. The timing at which the strobe timing is 0 corresponds to the set value of the timing at which the logical value of the signal under measurement changes. When the value of the strobe timing gets larger towards the positive direction, the timing becomes later with respect to the strobe timing 0. On the contrary, when the value of the strobe timing gets larger towards the negative direction, the timing becomes earlier with respect to the strobe timing 0.

Here, assume that mth strobe timing with respect to the strobe timing 0 is a strobe timing number m, where m is an integer. The generation timing of each strobe timing is approximately equal to a summation of 1) a value obtained by multiplying an adjacent strobe timing interval by the strobe timing number m and 2) the timing of the strobe timing 0. For example, when the adjacent strobe timing interval is about 10 ps, the timing of the strobe timing number 15 is 150 ps after the timing of the strobe timing 0.

The longitudinal axis of FIG. 2 represents the number of samples in each strobe timing. The number of samples at the strobe timing m corresponds to the number of samples in which the logical value of the signal under measurement at the strobe timing number m changed from the logic value at the immediately preceding strobe timing number m−1. In the example of FIG. 2, the number of samples fluctuates between strobe timings, because the strobe signal intervals used in the measurement are not constant. This has caused the PDF to have an irregular form. If a cumulative density function (CDF) is created by cumulating the number of samples among the strobe timings of the PDF, the created CDF also has an irregular form and is not a smooth curve, attributable to rise and fall of the number of samples among the strobe timings.

Figure 3:
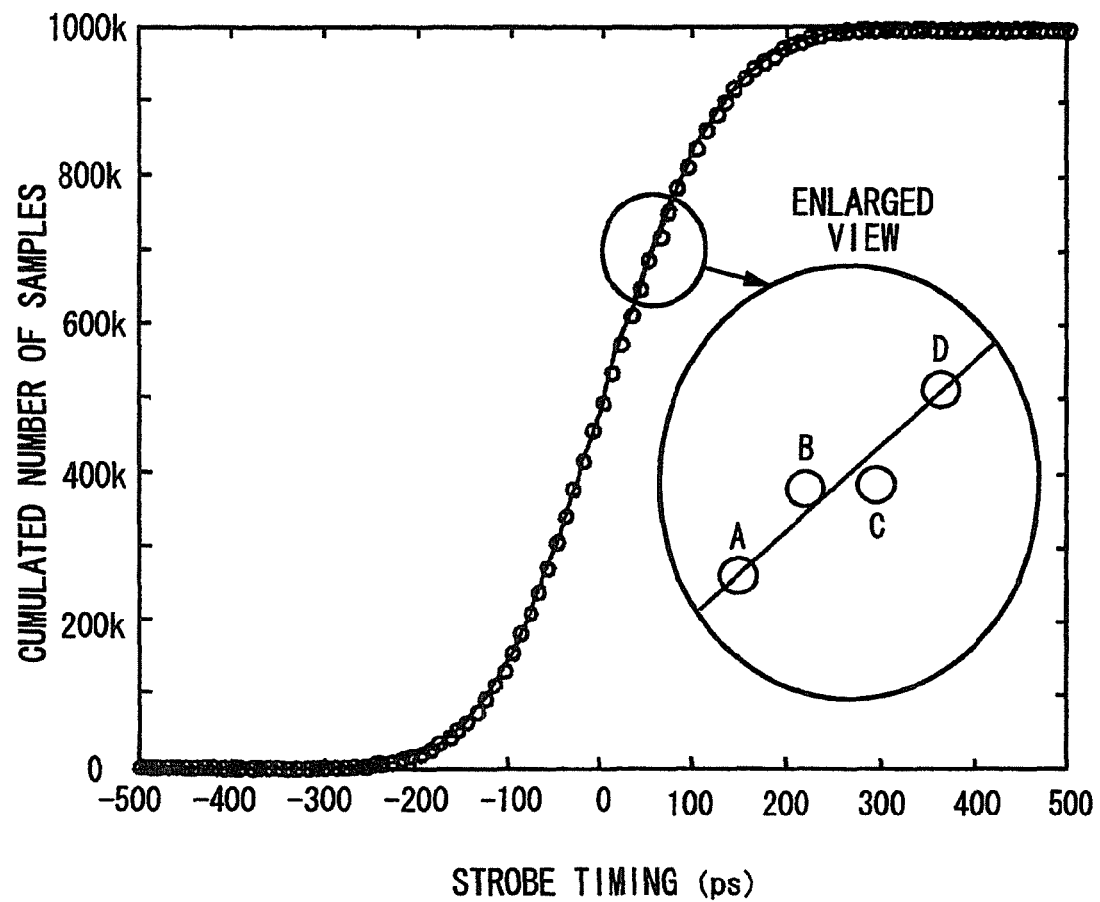
FIG. 3 shows a cumulative density function (CDF) created from the PDF of FIG. 2.

FIG. 3 shows a CDF created from the PDF of FIG. 2. The lateral axis of FIG. 3 represents strobe timings. The longitudinal axis of FIG. 3 represents the cumulative number of samples. The cumulative number of samples for the strobe timing number m is obtained by adding the number of samples for the strobe timing number m to the cumulative number of samples for the adjacent strobe timing number m−1.

In FIG. 3, the cumulative number of samples at each strobe timing is different from the cumulative number of samples when measured at ideal timings, because of inconstant strobe timing intervals. For example, A, B, C, D, in the enlarged view of FIG. 3 respectively correspond to the strobe timing numbers 5, 6, 7, and 8, and their respective ideal timings are 50 ps, 60 ps, 70 ps, and 80 ps. In reality, however, A, B, C, D in FIG. 3 represent the cumulative number of samples measured at strobe timings of 50 ps, 62 ps, 68 ps, and 80 ps, respectively. Accordingly, the cumulative number of samples at B and C are deviated from the solid line of the cumulative number of samples measured at the ideal timings. If an analysis of the signal under measurement is performed using such a CDF as deviated from the CDF measured at the ideal timings, the analysis result will be erroneous.

Taking this into consideration, the correcting apparatus 100 incorporates therein an interpolation section 20 and a corrected function generating section 30, so as to interpolate a CDF. The interpolation section 20 is supplied with a CDF of the measurement result. The correcting apparatus 100 may either be supplied with the CDF from outside, or generate the CDF within itself by using a PDF supplied form outside.

The interpolation section 20 interpolates the value between each strobe timing of the CDF, to calculate the value of the CDF at each ideal timing to obtain a corrected CDF at ideal timings. To be more specific, the interpolation section 20 performs interpolation on a CDF measured at non-linear strobe timings, to calculate a corrected CDF at strobe timings of constant intervals therebetween. For example, the interpolation section 20 may calculate the values of the corrected CDF respectively at the strobe timings 60 ps and 70 ps, to correct the values of the CDF respectively at B and C which used have strobe timings of 62 ps and 68 ps before the correction. As a result, the corrected CDF corresponding to the solid line of FIG. 3 can be obtained.

Based on the corrected CDF calculated by the interpolation section 20, the corrected function generating section 30 generates a corrected PDF in which errors of the strobe timings for the PDF have been corrected. For example, the corrected function generating section 30 may generate a corrected PDF based on differences in values of the corrected CDF between the adjacent ideal timings.

Specifically, when the strobe timing number at an ideal timing is assumed to be n (where n is an integer), the corrected function generating section 30 may generate a histogram, by using a corrected PDF value at the strobe timing number n calculated as a difference between a corrected CDF value at the strobe timing number n and a corrected CDF value at a strobe timing number n−1. The corrected function generating section 30 can also calculate the corrected PDF value at the strobe timing number n, as a difference between the corrected CDF value at the strobe timing number n and a corrected CDF value at a strobe timing number n+1.

The correcting apparatus 100 is able to perform interpolation with higher accuracy when interpolating a value between each strobe timing for a CDF without irregularity in shape, than when interpolating the corresponding value for a PDF having irregularities in shape. The corrected PDF generated based on the corrected CDF will be subject to smaller errors than a PDF obtained by interpolating a PDF as measured.

Figure 4:
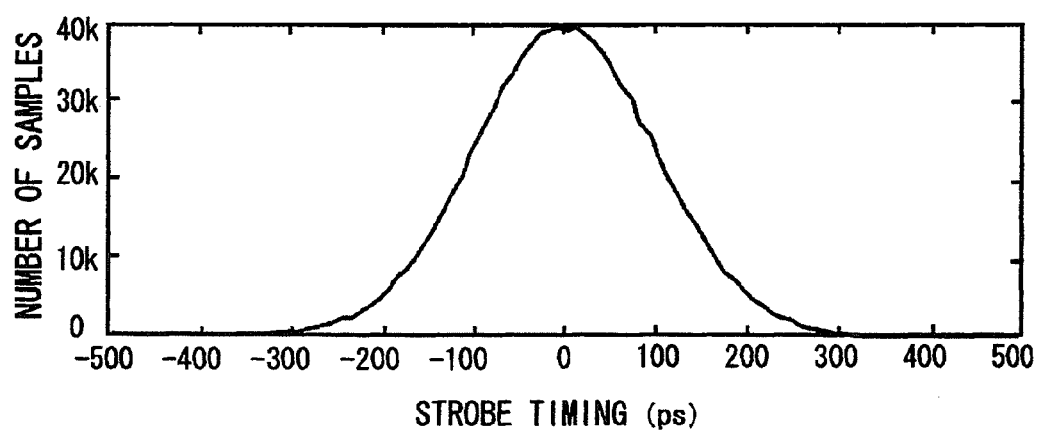
FIG. 4 shows an exemplary corrected PDF generated by a corrected function generating section 30.

FIG. 4 shows an exemplary corrected PDF generated by the corrected function generating section 30. The corrected PDF of FIG. 4 is obtained by converting, into a PDF, a corrected CDF resulting from interpolating a value between adjacent strobe timings in the CDF of FIG. 3. The irregularities in shape found in the PDF of FIG. 2 are not found in the corrected PDF of FIG. 4.

The interpolation is performed by estimating a value of f(x) for the value of x other than $x_k$(k=1, 2, . . . , n) when the value of the function y=f(x) is given for discontinuous values $x_1$, $x_2$, . . . , $x_n$ of the variable x. The interpolation section 20 may adopt any of the linear interpolation, the polynomial interpolation, or the cubic spline interpolation.

For example, when using the polynomial interpolation, the interpolation section 20 uses the following procedure. When two points on a plane, namely, ($x_1$, $y_1$) and ($x_2$, $y_2$) are given, a straight line y=$P_1$(x) passing the two points is uniquely defined by the following equation.

$$y = P_1(x) = \frac{x - x_2}{x_1 - x_2} y_1 + \frac{x - x_1}{x_2 - x_1} y_2$$

Because of using a straight line, this interpolation is also referred to as "linear interpolation."

Generally speaking, an N−1$^{th}$ order curve y=$P_{N-1}$(x) that passes N points ($x_1$, $y_1$), ($x_2$, $y_2$), . . . , ($x_N$, $y_N$) is uniquely defined by the following equation based on the Lagrange's formula.

$$y = P_{N-1}(x) = \frac{(x - x_2)(x - x_3) \ldots (x - x_N)}{(x_1 - x_2)(x_1 - x_3) \ldots (x_1 - x_N)} y_1 + \\ \frac{(x - x_1)(x - x_3) \ldots (x - x_N)}{(x_2 - x_1)(x_2 - x_3) \ldots (x_2 - x_N)} y_2 + \\ \ldots + \frac{(x - x_1)(x - x_2) \ldots (x - x_{N-1})}{(x_N - x_1)(x_N - x_2) \ldots (x_N - x_{N-1})}$$

The interpolation section 20 is able to calculate the value of the CDF at each ideal timing by using this interpolation. Note that the polynomial interpolation is explained in detail in "L.

W. Johnson and R. D. Riess, Numerical Analysis, Massachusetts: Addison-Wesley, Section 5.2, 1982," for example.

The interpolation section 20 may also adopt the cubic spline interpolation as explained below. A spline curve is defined as passing a predetermined point and that the square integral of its curvature takes the minimal value. A spline curve passing two given points $(x_1, y_1)$ and $(x_2, y_2)$ on a plane is defined by the following equations.

$$y = Ay_1 + By_2 + Cy_1'' + Dy_2''$$

$$A \equiv \frac{x_2 - x}{x_2 - x_1}$$

$$B \equiv 1 - A = \frac{x - x_1}{x_2 - x_1}$$

$$C \equiv \frac{1}{6}(A^3 - A)(x_2 - x_1)^2$$

$$D \equiv \frac{1}{6}(B^3 - B)(x_2 - x_1)^2$$

Here, each of y1" and y2" is the second order derivative of a function y=f(x) at the $(x_1, y_1)$ and $(x_2, y_2)$, respectively. The cubic spline interpolation estimates the value of y=f(x) for a desired x, using the above equations and two measured points and the second order derivatives at the two measured points. It is preferable that the interpolation section 20 select the two points that are close to x, so as to reduce the approximation error of the interpolated curve.

As described above, the correcting apparatus 100 according to the present embodiment generates a corrected PDF without irregularities in shape, based on a corrected CDF generated by interpolating a value between strobe timings of an inputted CDF. Analysis of a signal under measurement using this corrected PDF will be more accurate than conventional methods.

Figure 5:
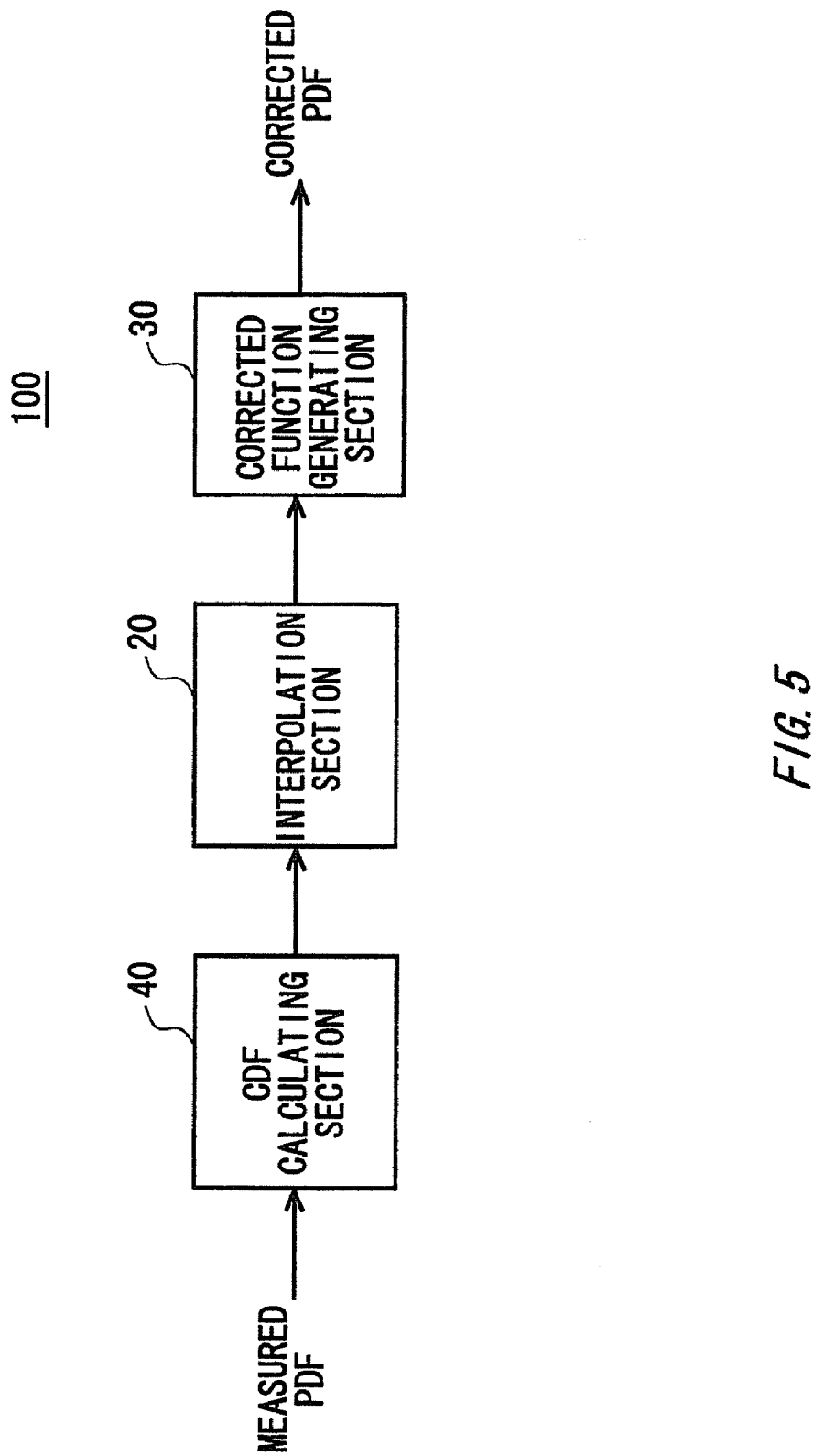
FIG. 5 shows another configuration of the correcting apparatus 100.

FIG. 5 shows another configuration of the correcting apparatus 100. The correcting apparatus 100 includes a CDF calculating section 40 in addition to the correcting apparatus 100 of FIG. 1. When a PDF based on a measurement result is provided, the CDF calculating section 40 accumulates the values of the PDF at each strobe timings. The CDF calculating section 40 calculates a CDF based on the PDF value accumulation, and provides the interpolation section 20 with the calculated CDF. The CDF calculating section 40 may receive a PDF of a measurement result at strobe timings whose relative phase with respect to the measurement target varies non-linearly.

Specifically, the CDF calculating section 40 calculates an accumulation at the strobe timing number n (where n is an integer), by adding the number of samples at the strobe timing number n to an accumulation thereof at the strobe timing number n−1 and all the strobe timing numbers below n−1. For example, an accumulation at the strobe timing number 0 for the CDF of FIG. 3 may be obtained by adding the number of samples at the strobe timing number 0 to the total number of samples at the strobe timing number −1 and all the strobe timing numbers below −1 at the PDF of FIG. 2. The CDF calculating section 40 generates the CDF of FIG. 3 corresponding to the PDF of FIG. 2, by repeating the explained addition, from the strobe timing number −50 up to the strobe timing number +50. The CDF calculating section 40 may start the accumulation when the number of samples becomes more than 0. The CDF calculating section 40 may end the accumulation when the number of samples becomes 0.

When calculating an accumulation at the strobe timing number n, the CDF calculating section 40 may add the number of samples at the strobe timing number n to an accumulation thereof at the strobe timing numbers equal to or greater than n+1. For example, the PDF calculating section 40 may calculate an accumulation at the strobe timing number 0, by adding the number of samples at the strobe timing number 0 to an accumulation thereof at the strobe timing numbers equal to or greater than 1.

The CDF calculating section 40 may calculate the accumulation at strobe timings, up to when the difference between the accumulation at the strobe timing number n and the accumulation at the strobe timing number n−1 becomes equal to or below a predetermined value. For example, when the strobe timing is equal to or greater than 300 ps in FIG. 2, the number of samples is approximately 0. Therefore, when the strobe timing number is equal to or greater than 30, the accumulation at the strobe timing number n becomes substantially equal to the accumulation at the strobe timing number n−1. In view of this, the CDF calculating section 40 may calculate the accumulation at the strobe timings below 300 ps, and does not have to calculate accumulations at the strobe timings equal to or greater than 300 ps.

For a CDF of the measurement result at the strobe timings, the correcting apparatus 100 may generate a corrected PDF that is equivalent to a PDF resulting from interpolating a value between each strobe timing of the CDF, calculating a corrected CDF at the ideal timings, and generating the corrected PDF based on the corrected CDF Specifically, the correcting apparatus 100 may not include the CDF calculating section 40, and the interpolation section 20 may generate a corrected PDF without calculating a corrected CDF. For example, the correcting apparatus 100 may generate a corrected PDF by substituting accumulations at strobe timings of a CDF of the measurement result to a predetermined arithmetic expression. The correcting apparatus 100 may store the arithmetic expression to an information recording medium such as a nonvolatile memory.

Figure 6:
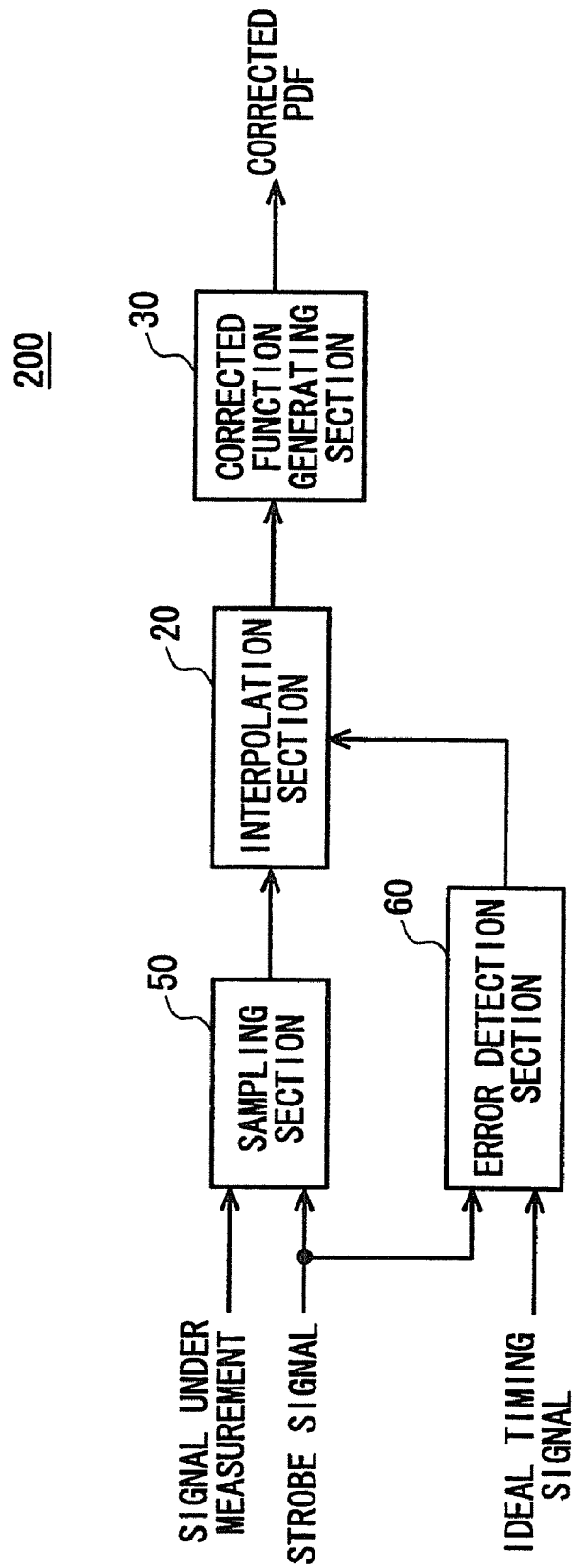
FIG. 6 shows a configuration of a PDF measurement apparatus 200.

FIG. 6 shows a configuration of the PDF measurement apparatus 200. The PDF measurement apparatus 200 measures a PDF of a measurement target. The PDF measurement apparatus 200 includes an interpolation section 20, a corrected function generating section 30, a sampling section 50, and an error detection section 60.

The sampling section 50 measures a characteristic of a measurement target at strobe timings having errors with respect to ideal timings of constant intervals, thereby generating a CDF as the measurement result. For example, the sampling section 50 measures the measurement target at strobe timings whose relative phase with respect to the measurement target varies non-linearly. The sampling section 50 may also generate a PDF based on the CDF of the measurement result.

The interpolation section 20 obtains the CDF of the measurement result. The interpolation section 20 interpolates the value between each strobe timing of the CDF, to calculate the value of the CDF at each ideal timing to obtain a corrected CDF at ideal timings. Based on the corrected CDF calculated by the interpolation section 20, the corrected function generating section 30 generates a corrected PDF in which errors of the strobe timings for the PDF have been corrected.

The strobe signal inputted to the sampling section 50 may be generated by delaying a reference signal using a variable delay circuit or the like. The set value of the delay time with respect to the reference signal may be set to a value corresponding to the ideal strobe timing. Here, note that the ideal strobe timing is such that its relative phase with respect to a measurement target varies linearly.

A variable delay circuit and an analog-to-digital converter for controlling the variable delay circuit have non-linearity with respect to a set value. Consequently, the delay time of the strobe signal outputted from the variable delay circuit will be deviated from the reference signal. Specifically, even when the delay time is set at a predetermined interval, the signal outputted from the variable delay circuit may be generated at an interval different from the set ideal interval.

In view of this, the error detection section 60 detects errors (i.e. deviation) of strobe timings with respect to ideal timings. The error detection section 60 may obtain a timing signal generated at an ideal timing interval from outside. The error detection section 60 may calculate the error of the strobe timing, by comparing the ideal timing to the generation timing of the strobe signal inputted to the sampling section 50.

The error detection section 60 may detect the non-linearity of the strobe timing. The specific procedure thereof is as follows.

First, the error detection section 60 sets a default value to a variable delay circuit, thereby generating a strobe signal. Next, the error detection section 60 samples predetermined measurement data using the strobe signal outputted from the variable delay circuit, a plurality of number of times. The error detection section 60 measures a bit error rate by comparing the sampling value with a pre-defined expected value.

The error detection section 60 sequentially shifts the phase of the measurement data in synchronization with a highly accurate clock inputted from outside. The error detection section 60 measures the bit error rate for each phase, and then detects the quantity of phase shift at which the bit error rate takes on a predetermined value. The error detection section 60 may detect the phase at which the timing of the strobe signal is substantially equal to the transition timing of the measurement data, by detecting the quantity of phase shift at which the bit error rate becomes 0.5.

Next, the error detection section 60 changes the set value of the variable delay circuit. The error detection section 60 samples the measurement data using the strobe signal outputted from the variable delay circuit whose set value has been changed, thereby measuring the bit error rate. The error detection section 60 detects the quantity of phase shift of the measurement data, at which the bit error rate takes on a predetermined value.

The error detection section 60 sequentially changes the set value of the variable delay circuit, so as to detect, at each set value, the quantity of phase shift of the measurement data at which the bit error rate takes on a predetermined value. When the set value of the variable delay circuit is changed linearly, the error detection section 60 may determine that the strobe timing is linear, if the detected quantity of phase shift also changes linearly. On the contrary, the error detection section 60 may determine that the strobe timing has non-linearity if the detected quantity of phase shift changes non-linearly even if the set value of the variable delay circuit is changed linearly.

For example, the error detection section 60 sequentially sets set values of 0ps, 50 ps, and 100 ps to the variable delay circuit. The error detection section 60 determines that the strobe timing is linear, if the quantities of phase shift of the measurement data at the set values are respectively 0 ps, 50 ps, and 100 ps when the bit error rate takes on a predetermined value. On the contrary, when the quantities of phase shift of the measurement data at the set values are respectively 0 ps, 51 ps, and 103 ps, the error detection section 60 determines that the strobe timing is non-linear.

Figure 7:
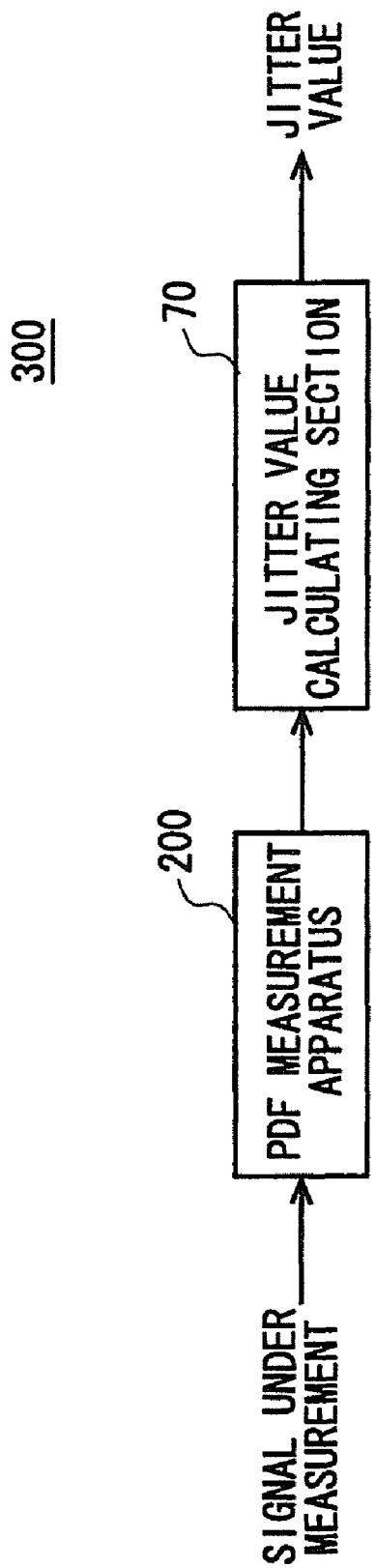
FIG. 7 shows a configuration of a jitter measurement apparatus 300.

FIG. 7 shows a configuration of a jitter measurement apparatus 300. The jitter measurement apparatus 300 measures the jitter value of a signal under measurement. The jitter measurement apparatus 300 includes the PDF measurement apparatus 200 shown in FIG. 6 as well as the jitter value calculating section 70.

The jitter value calculating section 70 calculates the jitter value of the signal under measurement, based on the corrected PDF generated by the PDF measurement apparatus 200. The jitter measurement apparatus 300 may calculate the RMS value of the corrected PDF as the jitter value. The jitter measurement apparatus 300 may also calculate, as the jitter value, a difference (p-p value) between the maximum strobe timing at which the corrected PDF is non-zero and the minimum strobe timing at which the corrected PDF is non-zero.

As stated above, the jitter measurement apparatus 300 according to the present embodiment measures the jitter value based on the corrected PDF generated by the PDF measurement apparatus 200. Since the corrected PDF is highly accurate, the jitter value measured based thereon will be highly accurate too.

Figure 8:
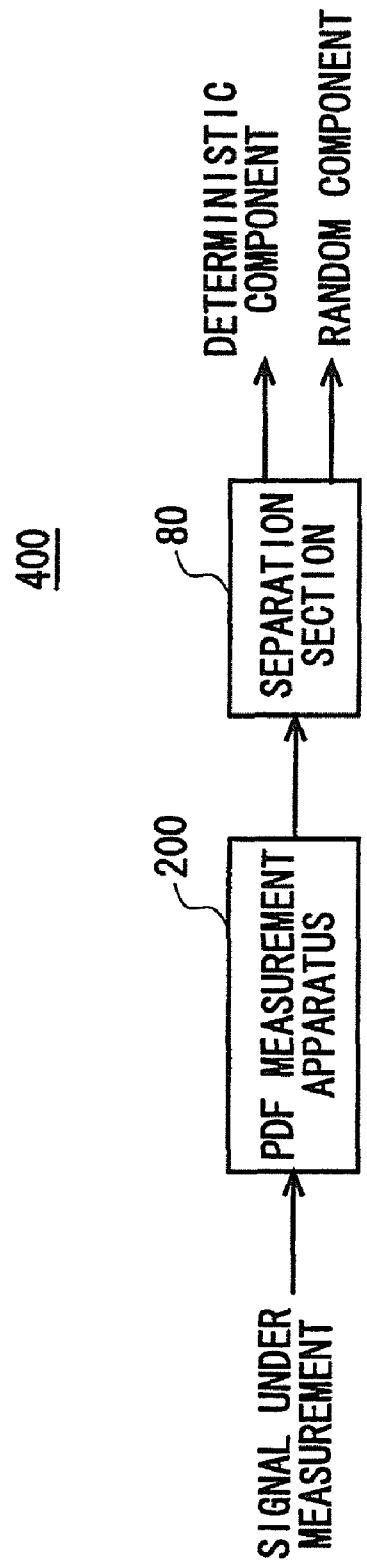
FIG. 8 shows a configuration of a jitter separation apparatus 400.

FIG. 8 shows a configuration of a jitter separation apparatus 400. A signal having a logical value transition at a predetermined timing contains jitter that contains a deterministic component and a random component. For example, deterministic jitter is data dependent jitter, duty cycle distortion, bounded uncorrelated jitter, or sinusoidal jitter. Random jitter is fluctuation of a timing edge that the random noise injects.

The jitter separation apparatus 400 separates at least one of the deterministic component and the random component from the measurement result of the jitter of the signal under measurement. The jitter separation apparatus 400 includes the PDF measurement apparatus 200 of FIG. 6 as well as a separation section 80. The PDF measurement apparatus 200 measures the PDF of the jitter of the signal under measurement.

The separation section 80 separates at least one of the deterministic component and the random component from the PDF measured by the PDF measurement apparatus 200. For example, the separation section 80 may extract the random component of the jitter by fitting the leading edge and the trailing edge of the PDF in the Gaussian distribution. The separation section 80 may extract the deterministic component of the jitter by removing the random component extracted from the probability measured by the PDF measurement apparatus 200.

The separation section 80 may Fourier transform the PDF, thereby obtaining the deterministic component from a first null frequency in the spectrum after the Fourier transform. The first null frequency is defined as the lowest of all the frequencies at which the spectrum power is approximately 0, or the frequencies at which the spectrum exhibits the minimum value.

The separation section 80 calculates the theoretical value of the spectrum of the deterministic component, based on the first null frequency. The separation section 80 may determine the type of the deterministic component contained in the jitter corresponding to the PDF, by comparing the calculated theoretical value to a plurality of predetermined models of deterministic components. The theoretical value of the deterministic component can be defined by a deterministic component model and a p-p value. The deterministic component model may be a sinusoidal distribution model, a uniform distribution model, a trapezoidal distribution model, and a dual-Dirac model, for example.

As described above, the jitter separation apparatus 400 according to the present embodiment separates the random component and the deterministic component of the jitter, based on the PDF measured by the PDF measurement apparatus 200. The PDF measured by the PDF measurement apparatus 200 is highly accurate. As a result, the jitter separation apparatus 400 is able to separate the random component and the deterministic component with high accuracy.

Figure 9:
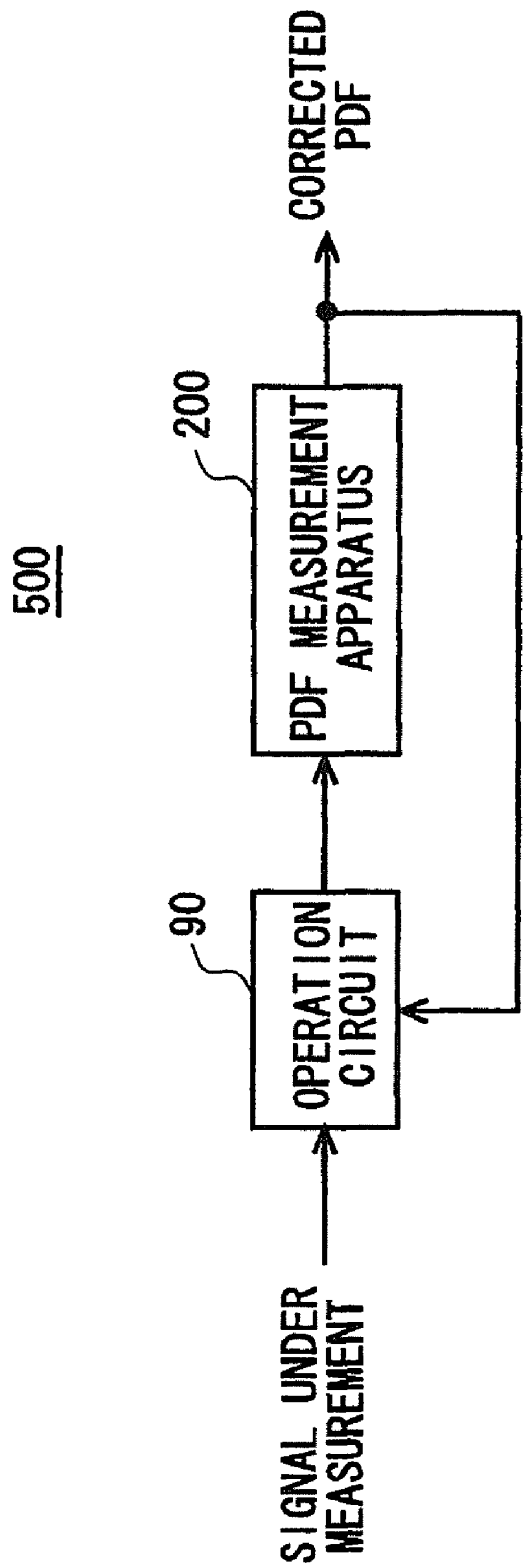
FIG. 9 shows a configuration of an electronic device 500.

FIG. 9 shows a configuration of an electronic device 500. The electronic device 500 operates according to a signal supplied thereto. The electronic device 500 includes an operation circuit 90 and a PDF measurement apparatus 200. The operation circuit 90 generates a response signal in accordance with the supplied signal. The PDF measurement apparatus 200 measures the PDF of the characteristic of the response signal.

Specifically, the operation circuit 90 generates the response signal having a predetermined pattern, in accordance with the supplied signal. The operation circuit 90 obtains a corrected PDF generated by the PDF measurement apparatus 200, and compares the corrected PDF to a pre-stored PDF model. The operation circuit 90 may assess the characteristic of the supplied signal, according to the comparison result.

For example, when the PDF generated by the PDF measurement apparatus 200 contains a difference from the pre-stored PDF model that falls within a predetermined range, the operation circuit 90 may determine that the characteristic of the supplied signal is good. When the PDF generated by the PDF measurement apparatus 200 contains a difference from the pre-stored PDF model which is out of the predetermined range, the operation circuit 90 may determine that the characteristic of the supplied signal is not good, and reports such to outside.

Figure 10:
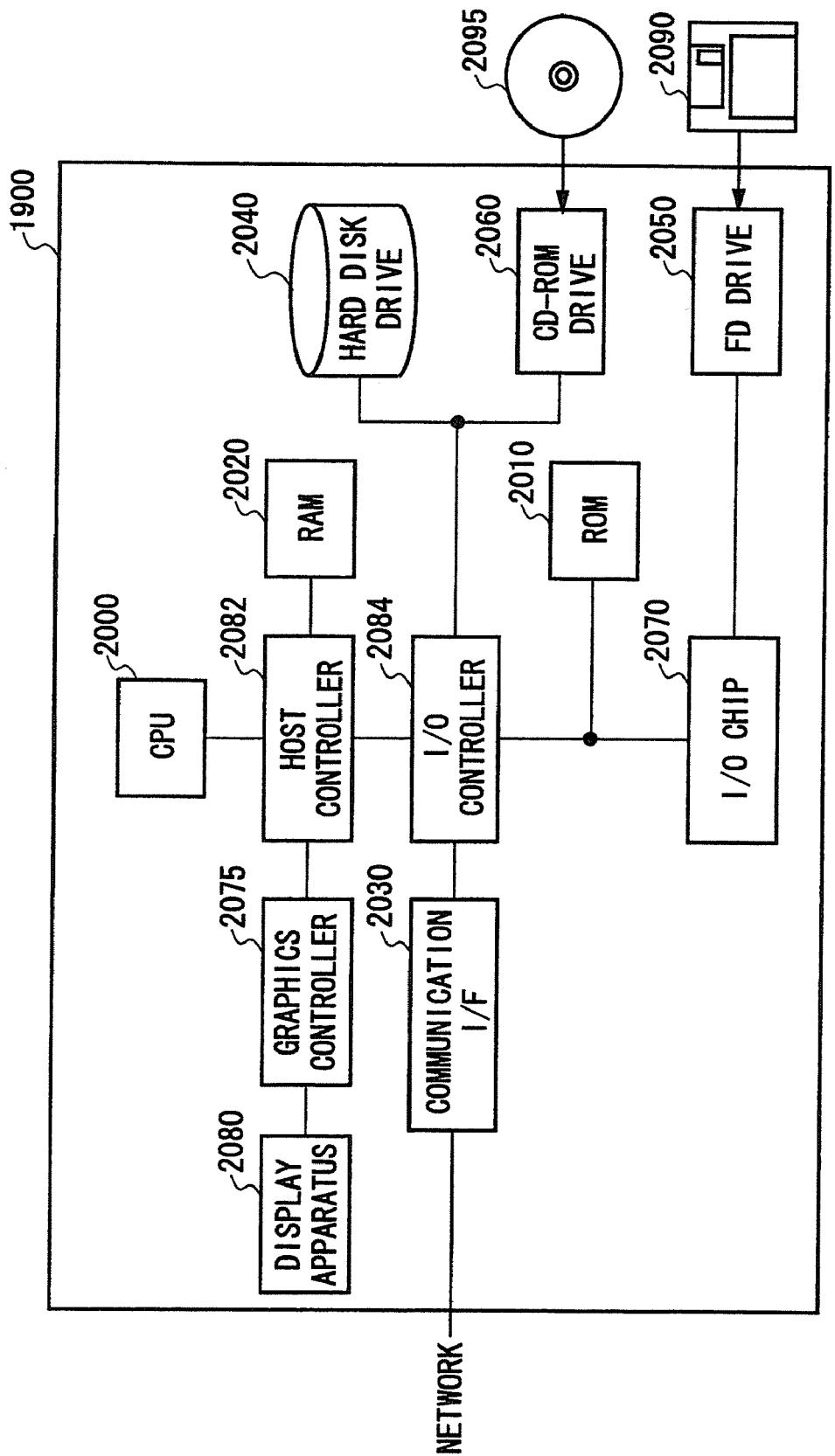
FIG. 10 shows a configuration of a computer 1900 that functions as the correcting apparatus 100.
Figure 11:
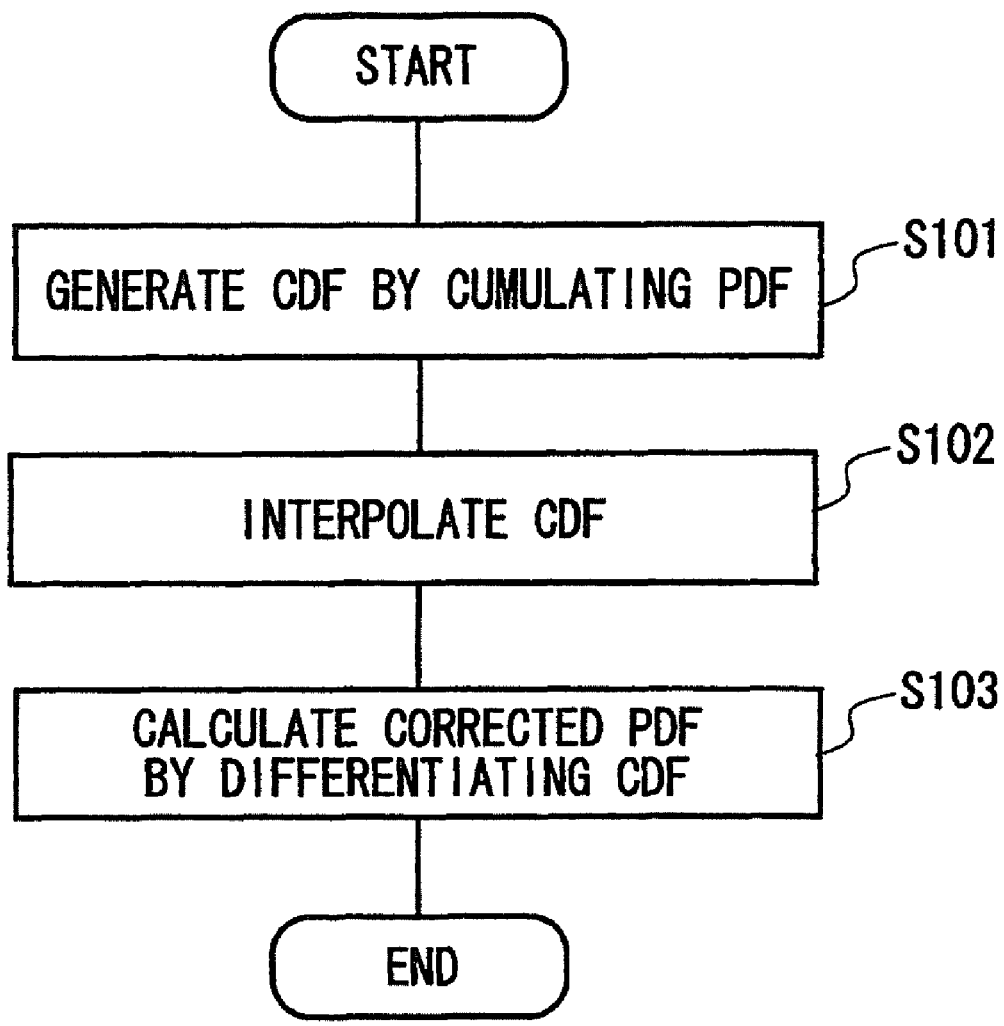
FIG. 11 is an operational flow chart of the computer 1900 that functions as the correcting apparatus 100.

FIG. 10 shows a configuration of a computer 1900 that functions as the correcting apparatus 100. FIG. 11 is an operational flow chart of the computer 1900 that functions as the correcting apparatus 100. The computer 1900 according to the present embodiment is equipped with a CPU periphery that includes a CPU 2000, a RAM 2020, a graphics controller 2075, and a display apparatus 2080 which are mutually connected by a host controller 2082. The computer 1900 is also equipped with an input/output unit having a communication interface 2030, a hard disk drive 2040, and a CD-ROM drive 2060 which are connected to the host controller 2082 via an input/output controller 2084, and a legacy input/output unit having a ROM 2010, a flexible disk drive 2050, and an input/output chip 2070 which are connected to the input/output controller 2084.

The host controller 2082 connects the RAM 2020 with the CPU 2000 and the graphics controller 2075 which access the RAM 2020 at a high transfer rate. The CPU 2000 operates according to programs stored in the ROM 2010 and the RAM 2020, thereby controlling each unit. The graphics controller 2075 obtains image data generated by the CPU 2000 or the like on a frame buffer provided in the RAM 2020, and causes the image data to be displayed on the display apparatus 2080. Alternatively, the graphics controller 2075 may contain therein a frame buffer for storing image data generated by the CPU 2000 or the like.

The input/output controller 2084 connects the host controller 2082 with the communication interface 2030, the hard disk drive 2040, and the CD-ROM drive 2060, which are relatively high-speed input/output apparatuses. The communication interface 2030 communicates with other apparatuses via a network. The hard disk drive 2040 stores a program and data used by the CPU 2000 within the computer 1900. The CD-ROM drive 2060 reads the program or the data from the CD-ROM 2095, and provides the hard disk drive 2040 with the program or the data via the RAM 2020.

The ROM 2010, and the flexible disk drive 2050 and the input/output chip 2070 which are relatively low-speed input/output apparatuses are connected to the input/output controller 2084. The ROM 2010 stores therein a boot program executed by the computer 1900 at the time of activation, a program depending on the hardware of the computer 1900, or the like. The flexible disk drive 2050 reads the programs or data from a flexible disk 2090, and provides the hard disk drive 2040 with the programs or data via the RAM 2020. The input/output chip 2070 connects the flexible disk drive 2050 to the input-/output controller 2084 as well as connecting various input/output apparatuses to the input/output controller 2084 via a parallel port, a serial port, a keyboard port, a mouse port, and the like.

A program to be provided for the hard disk drive 2040 via the RAM 2020 is provided by a user by being stored in such a recording medium as the flexible disk 2090, the CD-ROM 2095, or an IC card. The program is read from the recording medium, installed into the hard disk drive 2040 within the computer 1900 via the RAM 2020, and executed in the CPU 2000.

A program that is installed in the computer 1900 and causes the computer 1900 to function as the correcting apparatus 100 causes the computer 1900 to generate a CDF by cumulating an inputted PDF (S101). Next, the program causes the computer 1900 to interpolate data between strobe timings of the generated CDF (S102). Furthermore, the program causes the computer 1900 to generate a corrected PDF by differentiating the CDF (S103).

The information processing described in these programs is read into the computer 1900, thereby functioning as the interpolation section 20, the corrected function generating section 30, and the CDF calculating section 40, which are concrete means resulting from cooperation between software and the above-explained various types of hardware resources. The concrete means realizes the computation or processing of information for the specific usage of the computer 1900 according to the present embodiment, thereby realizing the correcting apparatus 100 for the specific usage.

For example, if there is communication between the computer 1900 and an external apparatus or the like, the CPU 2000 performs the communication program loaded in the RAM 2020, and provides the communication interface 2030 with communication processing instructions based on the content of the process recorded in the communication program. The communication interface 2030 is controlled by the CPU 2000 to read the transmission data stored in the transmission buffer area or the like on the recording apparatus, such as the RAM 2020, the hard disc 2040, the flexible disk 2090, or the CD-ROM 2095, and send this transmission data to the network, and to write data received from the network onto a reception buffer area on the recording apparatus or the like. In this way, the communication interface 2030 may exchange data with the recording apparatus through DMA (Direct Memory Access). As another possibility, the CPU 2000 may transmit the data by reading the data from the recording apparatus or communication interface 2030 that are the origins of the transmitted data, and writing the data onto the communication interface 2030 or the recording apparatus that are the transmission destinations.

The CPU 2000 may perform various processes on the data in the RAM 2020 by reading into the RAM 2020, through DMA transmission or the like, all or a necessary portion of the database or files stored in the external apparatus such as the hard disk drive 2040, the CD-ROM drive 2060 (CD-ROM 2095), the flexible disk drive 2050 (flexible disk 2090), or the like. The CPU 2000 writes the processed data back to the external apparatus through DMA transmission or the like.

In this process, the RAM 2020 is considered to be a section that temporarily stores the content of the external recording apparatus, and therefore the RAM 2020, the external apparatus, and the like in the present embodiment are collectively referred to as a memory, a recording section, a recording apparatus, and the similar kind. The variety of information in the present embodiment, such as the variety of programs, data, tables, databases, and the like are stored on such recording apparatuses to undergo information processing. The CPU 2000 can hold a portion of the RAM 2020 in a cache memory, to read from or write to the cache memory. With such a configuration as well, the cache memory serves part of the function of the RAM 2020, and therefore the cache memory is also included in the RAM 2020, the memory, and/or the recording apparatus in the present invention, except when a distinction is made.

The CPU 2000 executes the various processes such as the computation, information processing, condition judgment, searching for and replacing information, and the like included in the present embodiment for the data read from the RAM 2020, as designated by the command sequence of the program, and writes the result back onto the RAM 2020. For example, when performing condition judgment, the CPU 2000 judges whether a variable of any type shown in the present embodiment fulfills a condition of being greater than, less than, no greater than, no less than, or equal to another variable or constant. If the condition is fulfilled, or unfulfilled, depending on the circumstances, the CPU 2000 branches into a different command sequence or calls a subroutine.

The CPU 2000 can search for information stored in a file in the recording apparatus, the database, and the like. For example, if a plurality of entries associated respectively with a first type of attribute value and a second type of attribute value are stored in the recording apparatus, the CPU 2000 can search for entries fulfilling a condition designated by the first type of attribute value from among the plurality of entries stored in the recording apparatus. The CPU 2000 can then obtain the second type of attribute value associated with the first type of attribute value fulfilling the predetermined condition by reading the second type of attribute value stored at the same entry.

The programs and modules shown above may also be stored in an external recording medium. The flexible disk 2090, the CD-ROM 2095, an optical recording medium such as a DVD or CD, a magneto-optical recording medium such as MO, a tape medium, a semiconductor memory such as an IC card, or the like can be used as the recording medium. Furthermore, a recording apparatus such as a hard disk or RAM that is provided in a server system connected to the Internet or a dedicated communication network may be used to provide the programs to the computer 1900 via the network.

Although some aspects of the present invention have been described by way of exemplary embodiments, it should be understood that those skilled in the art might make many changes and substitutions without departing from the spirit and the scope of the present invention which is defined only by the appended claims.

The operations, the processes, the steps, or the like in the apparatus, the system, the program, and the method described in the claims, the specification, and the drawings are not necessarily performed in the described order. The operations, the processes, the steps, or the like can be performed in an arbitrary order, unless the output of the former-described processing is used in the later processing. Even when expressions such as "First," or "Next," or the like are used to explain the operational flow in the claims, the specification, or the drawings, they are intended to facilitate the understanding of the invention, and are never intended to show that the described order is mandatory.

As clear from the foregoing, one embodiment of the present invention provides a correcting apparatus, a PDF measurement apparatus, a jitter measurement apparatus, a jitter separation apparatus, an electronic device, a correction method, a program, and a recording medium, for generating a corrected PDF based on a corrected CDF generated by interpolating values of a CDF.

What is claimed is:

1. A correcting apparatus for correcting a probability density function (PDF) obtained from a measurement result of measuring a characteristic of a measurement target at strobe timings including errors with respect to ideal timings at predetermined intervals, the correcting apparatus comprising:
an interpolation section that is supplied with a cumulative density function (CDF) of the measurement result and calculates a corrected CDF at the ideal timings by interpolating values of the corrected CDF between the strobe timings of the supplied CDF; and
a corrected function generating section that generates a corrected PDF in which the errors of the strobe timings for the PDF have been corrected, based on the corrected CDF calculated by the interpolation section.

2. The correcting apparatus according to claim 1, wherein the corrected function generating section generates the corrected PDF, based on a difference in values of the corrected CDF between adjacent ideal timings.

3. The correcting apparatus according to claim 2, further comprising:
a CDF calculating section that is supplied with the PDF, calculates the CDF by summing the values of the PDF calculated at each of the strobe timings, and provides the interpolation section with the calculated CDF.

4. The correcting apparatus according to claim 3, wherein the ideal timings are at constant intervals or vary linearly with respect to constant intervals, and
the correcting apparatus receives the PDF of the measurement result at strobe timings that are non-linear with respect to the constant intervals.

5. A computer program product having computer instructions, recorded on a non-transitory computer readable medium, for enabling a computer executing the computer instructions to function as the correcting apparatus according to claim 1.

6. The non-transitory computer readable medium on which the computer instructions of the computer program product according to claim 5 are recorded.

7. A probability density function (PDF) measurement apparatus for measuring a PDF of a measurement target, comprising:
a sampling section that measures a characteristic of the measurement target at strobe timings including errors with respect to ideal timings of predetermined intervals, and generates a PDF of a measurement result;
an interpolation section that is supplied with a cumulative density function (CDF) of the measurement result and calculates a corrected CDF at the ideal timings by interpolating values of the corrected CDF between the strobe timings of the supplied CDF; and
a corrected function generating section that generates a corrected PDF in which the errors of the strobe timings for the PDF have been corrected, based on the corrected CDF calculated by the interpolation section.

8. The PDF measurement apparatus according to claim 7, further comprising:
an error detection section that detects the errors of the strobe timings with respect to the ideal timings, wherein
the interpolation section generates the corrected PDF further based on the errors detected by the error detection section.

9. The PDF measurement apparatus according to claim 8, wherein
the ideal timings are at constant intervals or vary linearly with respect to constant intervals,
the sampling section measures the measurement target at strobe timings that are non-linear with respect to the constant intervals, and
the error detection section detects the non-linearity of the strobe timings.

10. The PDF measurement apparatus according to claim 8, wherein
the error detection section obtains a timing signal generated at an ideal timing interval, and calculates the errors of the strobe timings by comparing the ideal timing interval to the strobe timings.

11. The PDF measurement apparatus according to claim 8, wherein
the error detection section sets a default delay amount to a variable delay circuit, samples predetermined measurement data using a strobe signal output from the variable delay circuit, and measures a bit error rate by comparing a result of the sampling with a pre-defined expected value.

12. The PDF measurement apparatus according to claim 11, wherein
the error detection section sequentially shifts the phase of the predetermined measurement data, measures the bit error rate for each phase, and detects the quantity of phase shift at which the bit error rate takes on a predetermined value.

13. The PDF measurement apparatus according to claim 12, wherein
the error detection section sequentially changes the delay amount of the variable delay circuit.

14. A jitter measurement apparatus for measuring a jitter value of a signal under measurement, comprising:
the PDF measurement apparatus according to claim 7 that measures a PDF of the jitter value of the signal under measurement; and
a jitter value calculating section that calculates the jitter value of the signal under measurement, based on the corrected PDF generated by the PDF measurement apparatus.

15. A jitter separation apparatus for separating at least one of a deterministic component and a random component from a measurement result of jitter of a signal under measurement, comprising:
the PDF measurement apparatus according to claim 7 that measures a PDF of a jitter value of the signal under measurement; and
a separation section that separates at least one of the deterministic component and the random component from the corrected PDF generated by the PDF measurement apparatus.

16. An electronic device that operates according to a signal supplied thereto, comprising:
an operation circuit that generates a response signal corresponding to the supplied signal; and
the PDF measurement apparatus according to claim 7 that measures a PDF of a characteristic of the response signal.

17. A correcting method for correcting a probability density function (PDF) obtained from a measurement result of measuring a characteristic of a measurement target at strobe timings including errors with respect to ideal timings at predetermined intervals, the correcting method performed by a correcting apparatus and comprising:
being supplied with a cumulative density function (CDF) of the measurement result calculating a corrected CDF at the ideal timings by interpolating values of the corrected CDF between the strobe timings of the supplied CDF using an interpolation section of the correcting apparatus; and
generating, using a corrected function generating section of the correcting apparatus, a corrected PDF in which the errors of the strobe timings for the PDF have been corrected, based on the corrected CDF having been calculated.

18. A correcting apparatus for correcting a probability density function (PDF) obtained from a measurement result of measuring a characteristic of a measurement target at strobe timings including errors with respect to ideal timings at predetermined intervals, the correcting apparatus comprising:
an interpolation section that, for a cumulative density function (CDF) of the measurement result at the strobe timings, generates a corrected PDF by substituting accumulations at strobe timings of the CDF of the measurement result into a predetermined arithmetic expression, the corrected PDF being equivalent to a PDF generated based on a corrected CDF calculated at the ideal timings by interpolating values of the corrected CDF between the strobe timings of the CDF of the measurement result.

19. A computer program product having computer instructions, recorded on a non-transitory computer readable medium, for enabling a computer executing the computer instructions to perform operations for correcting a probability density function (PDF) obtained from a measurement result of measuring a characteristic of a measurement target at strobe timings including errors with respect to ideal timings at predetermined intervals, the operations comprising:
being supplied with a cumulative density function (CDF) of the measurement result and calculating a corrected CDF at the ideal timings by interpolating values of the corrected CDF between the strobe timings of the supplied CDF; and
generating, a corrected PDF in which the errors of the strobe timings for the PDF have been corrected, based on the corrected CDF having been calculated.

20. The non-transitory computer readable medium on which the computer instructions of the computer program product according to claim 19 are recorded.

* * * * *